(12) United States Patent
Wu et al.

(10) Patent No.: US 6,417,082 B1
(45) Date of Patent: Jul. 9, 2002

(54) SEMICONDUCTOR STRUCTURE

(75) Inventors: Yider Wu, San Jose; Jean Yang, Sunnyvale; Hidehiko Shiraiwa, San Jose; Mark E. Ramsbey, Sunnyvale, all of CA (US)

(73) Assignees: Advanced Micro Devices, Inc., Sunnyvale, CA (US); Fujitsu Limited, Kanagawa (JP)

( * ) Notice: Subject to any disclaimer, the term of this patent is extended or adjusted under 35 U.S.C. 154(b) by 0 days.

(21) Appl. No.: 09/651,684

(22) Filed: Aug. 30, 2000

(51) Int. Cl.$^7$ .............................................. H01L 21/425
(52) U.S. Cl. ..................... 438/528; 438/520; 438/585
(58) Field of Search ................. 438/514, 528, 438/585, 515, 520

(56) References Cited

U.S. PATENT DOCUMENTS

| | | | |
|---|---|---|---|
| 5,250,456 A | * | 10/1993 | Bryant |
| 5,480,828 A | * | 1/1996 | Hsu et al. |
| 5,714,389 A | | 2/1998 | Charlton et al. |
| 5,937,310 A | * | 8/1999 | Gardner et al. ............. 438/440 |
| 5,960,274 A | | 9/1999 | Mehta |
| 6,040,216 A | * | 3/2000 | Sung ........................... 438/257 |
| 6,057,584 A | * | 5/2000 | Gardner et al. ............. 257/411 |
| 6,147,008 A | * | 11/2000 | Chwa et al. ................. 438/762 |

FOREIGN PATENT DOCUMENTS

| | | | |
|---|---|---|---|
| EP | 887842 A1 | * | 12/1998 |
| WO | WO-98/10464 | * | 3/1998 |
| WO | WO-98/27580 | * | 6/1998 |

OTHER PUBLICATIONS

C. T. Liu, Y. Ma et al. *Light Nitrogen Implant For Preparing Thin–Gate Oxides*, 18, No. 3, Mar. 1997, pp. 105–107.
Fullman Company—*The Semiconductor Manufacturing Process*, Fullman Kinetics, 1999, 45 pages <http://www-.fullman.com/semiconductors.html>.
Stanley Wolf, *Silicon Processing for the VLSI Era*, vol. 1, Lattice Press, 1986, pp. 516–517.
*Encyclopedia of Chemical Technology*, Kirk–Othmer, vol. 14, 1995, pp. 677–709.

* cited by examiner

Primary Examiner—Trung Dang
(74) Attorney, Agent, or Firm—Amin & Turocy, LLP

(57) ABSTRACT

A process for making a semiconductor structure comprises implanting nitrogen through a layer comprising $SiO_2$ into a substrate comprising Si, wherein the layer is on the substrate, and wherein the layer is from about 30 Å to about 300 Å thick.

26 Claims, 1 Drawing Sheet

SEMICONDUCTOR STRUCTURE

BACKGROUND

The present invention relates to semiconductor structures, semiconductor devices, electronic devices, and methods of making each.

It is known to implant nitrogen ions into semiconductor structures at a high dose to form an interface between a silicon substrate and a sacrificial dielectric layer to strengthen the bonding between the substrate and the dielectric layer. See C. T. Liu, Y. Ma, et al., "Light Nitrogen Implant for Preparing Thin-Gate Oxides" 18 (March 1997) No. 3, New York, pp. 105–107. After implantation of nitrogen through the sacrificial dielectric layer, the layer is stripped away and another oxide is grown. The nitrogen retards oxidation, so the new dielectric layer (the gate dielectric layer) is generally less than 20 Å thick. Liu indicates that a high does is necessary to achieve the improved bonding. However, the higher the dose, the thinner the new dielectric layer. For certain semiconductor structures, a dielectric layer less than 20 Å thick is undesireable.

This known procedure adds a step to the manufacturing process because the gate dielectric layer is needed to replace the sacrificial dielectric layer that was stripped away. This procedure also does not maximize the strength of interface bonding between the silicon substrate and the gate dielectric layer that can be gained through the implantation of nitrogen. The less-than-optimal strength of the interface bonding may interfere with the flash memory application of the semiconductor structure.

SUMMARY

The structures, devices, and processes described herein address at least some of the above-identified shortcomings.

In one aspect of the invention, a process for making a semiconductor structure comprises implanting nitrogen through a layer comprising $SiO_2$ into a substrate comprising Si, wherein the layer is on the substrate, and wherein the layer is from about 30 Å to about 300 Å thick.

In another aspect of the invention, a process for making a semiconductor structure comprises implanting nitrogen through a layer comprising $SiO_2$ into a substrate comprising Si, wherein the layer is on the substrate, and the layer is from about 30 Å to about 300 Å thick, and wherein the implanting causes defects; washing the semiconductor structure; and removing the defects.

In still another aspect of the invention, A process for making a semiconductor device, comprises (a) making a semiconductor structure comprising implanting nitrogen through a non-sacrificial layer comprising $SiO_2$ into a substrate comprising Si, wherein the layer is on the substrate, and the layer is from about 30 Å to about 300 Å thick, and wherein the implanting causes defects; washing the semiconductor device with an aqueous solution comprising ammonium hydroxide; removing the defects; and (b) converting the semiconductor structure into a semiconductor device.

The present invention provides the foregoing and other features, and the advantages of the invention will become further apparent from the following detailed description of the presently preferred embodiments, read in conjunction with the accompanying drawings. The detailed description and drawings are merely illustrative of the invention and do not limit the scope of the invention, which is defined by the appended claims and equivalents thereof.

DETAILED DESCRIPTION

Figure 1:
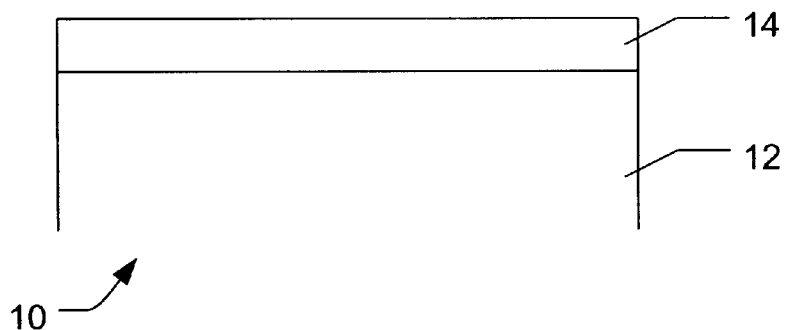
FIG. 1 is a semiconductor structure.

FIG. 1 shows a semiconductor structure 10 having a silicon substrate 12 and a dielectric layer 14. Preferably, the dielectric layer comprises $SiO_2$ (an oxide layer). Preferably, the dielectric layer is grown on the substrate to a thickness very close to the desired thickness of the final dielectric layer in the semiconductor device created from semiconductor structure 10. Preferably, the dielectric layer is non-sacrificial. That is, the dielectric layer on the substrate need not be stripped away after implantation of nitrogen ions. Preferably, the dielectric layer is from 30 Å to 300 Å, (+/–5 Å). More preferably, the dielectric layer is from 70 Å to 130 Å.

Optionally, a mask layer can be formed on the silicon substrate 12 using methods and materials well known in the art, as well as those described in U.S. Pat. No. 5,960,274 (Mehta), which is hereby incorporated by reference. Preferably, the mask layer is a photoresist layer patterned to prevent implantation in specific portions of the substrate.

In a preferred embodiment, nitrogen ions (either atomic or molecular) are implanted using standard equipment through a dielectric layer into a substrate comprising Si. Preferably, the layer is in contact with the substrate. Preferably, implanting is carried out using a plasma emersion doping system. The energy can range from about 1 KeV to about 50 KeV, preferably the energy is less than 10 KeV, more preferably the energy is less than 5 KeV. Any dose of nitrogen can be used. Preferably the dose is from about $1 \times 10^{13}$ $cm^{-2}$ to about $5 \times 10^{15}$ $cm^{-2}$. Any implant angle can be used. Preferably, the implant angle is from 0° to 75°.

Figure 2:
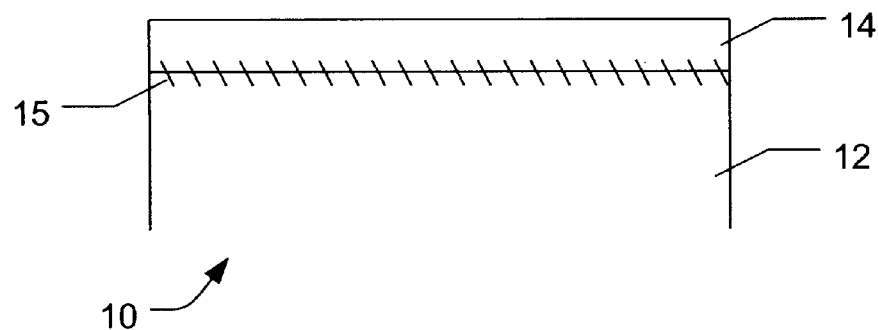
FIG. 2 is the semiconductor structure of FIG. 1 having defects.

FIG. 2 shows the semiconductor structure 10 after the nitrogen ions have been implanted through dielectric layer 14. Preferably, the nitrogen ions distribute about the implanting region 15 according to a Gaussian (normal) distribution pattern. The implanting process may cause contamination or defects to the semiconductor structure.

Advantageously, the nitrogen at the interface can enhance bonding, which strengthens the interface against such stresses as hot carrier stressing and other kinds of electrical stressing.

In a preferred embodiment, contamination is removed by washing the semiconductor structure. Preferably, the washing comprises a standard RCA clean. In a standard RCA clean, the semiconductor structure is immersed in a solution of $H_2O$—$NH_4OH$—$H_2O_2$ in an approximate ratio of 5:1:1 by volume. The solution is maintained at a preferred temperature of approximately 65° C. to 80° C. After approximately 5 to 15 minutes in the solution, the semiconductor structure is removed from the solution and rinsed in deionized water.

Typically, the semiconductor structure is then immersed for approximately 15 seconds in a 10:1 HF solution to remove any oxide formed during the first step. Next, the wafer is immersed in a solution of $H_2O$—$HCl$—$H_2O_2$ in an approximate ratio of 6:1:1 by volume heated to approximately 65° C. to 80° C. After approximately 5 to 15 minutes in the HCl solution, the semiconductor substrate is rinsed and dried. A standard RCA clean, which is well known to those of skill in the art, is described in Stanley Wolf's text, Semiconductor Processing For The VLSI Era, Vol. 1: Process Technology (1986) at 516–17.

The defects or contamination in or around implanting region 15 may be removed by any process well known in the art. Preferably, defects are removed through annealing or through reoxidizing. Annealing is preferably carried out at a temperature of from about 800° C. to about 1100° C., preferably from 900° C. to 1000° C. Reoxidizing is preferably carried out by a rapid thermal process in an oxidizing atmosphere at a temperature of from about 1000° C. to about 1300° C. for from about 100 seconds to about 140 seconds.

Figure 3:
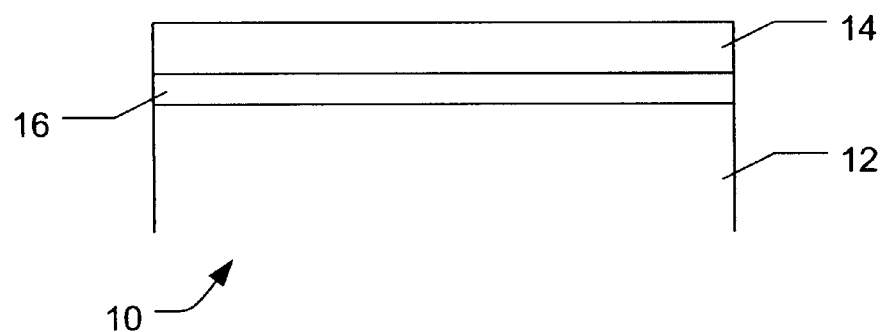
FIG. 3 is the semiconductor structure of FIG. 2 have substantially no defects.

FIG. 3 shows the semiconductor structure 10 after the contamination and defects have been removed. The nitrogen ions that have been implanted form interface 16, which is sandwiched between dielectric layer 14 and substrate 12. The semiconductor structure of FIG. 3 can be made into many types semiconductor device using techniques well known in the art.

Semiconductor devices can be made from the semiconductor structure of the invention using methods that are well known in the art. Exemplary, non-limiting semiconductor devices include integrated circuits, for example, a memory cell such as an SRAM, a DRAM, an EPROM, an EEPROM etc.; programmable logic devices; data communications devices; clock generation devices; etc.

Electronic devices can made that comprise the semiconductor devices formed from the semiconductor structure of the present invention using techniques well known in the art. Any electronic device (a device powered by either AC or DC or some combination thereof may include the semiconductor device made from the semiconductor structure of the invention. These electronic devices include but are not limited to mobile phones, automobiles, airplanes, computers, televisions, stereos, VCRs, CD-changers, microwave ovens, etc.

The individual processing steps for use in the present invention are well known to those of ordinary skill in the art, and are also described in Encyclopedia of Chemical Technology, Kirk-Othmer, Volume 14, pp. 677–709 (1995); Semiconductor Device Fundamentals, Robert F. Pierret, Addison-Wesley, 1996; and Microchip Fabrication 3rd. edition, Peter Van Zant, McGraw-Hill, 1997.

It should be appreciated that the present invention is capable of being incorporated in the form of a variety of embodiments, only a few of which have been illustrated and described above. The invention may be embodied in other forms without departing from its spirit or essential characteristics. The described embodiments are to be considered in all respects only as illustrative and not restrictive, and the scope of the invention is therefore indicated by the appended claims rather than by the foregoing description. All changes that come within the meaning and range of equivalency of the claims are embraced to be within their scope.

What is claimed is:

1. A process for making a semiconductor structure, comprising:
   implanting nitrogen through a layer comprising SiO2 into a substrate comprising Si, wherein the implanting creates defects, and wherein the layer is a non-sacrificial layer; and
   removing the defects via at least one of annealing and reoxidizing.

2. A semiconductor structure produced by the process of claim 1.

3. The process of claim 1 further comprising, after the implanting, washing the semiconductor structure.

4. The process of claim 1 wherein the layer is from 70 Å to 130 Å thick.

5. The process of claim 1 wherein the layer is in contact with the substrate.

6. The process of claim 1 wherein the layer is a gate oxide.

7. The process of claim 1, further comprising:
   forming a semiconductor device.

8. The process of claim 7 wherein the semiconductor device is a flash memory device.

9. The process of claim 7, wherein the semiconductor device is a memory cell.

10. The method of claim 7, further comprising:
    forming an electronic device that comprises the semiconductor device.

11. The process of claim 10, wherein the electronic device is a device selected from the group comprising mobile phone, computer, television, and stereo.

12. A process for making a semiconductor structure, comprising:
    a) implanting nitrogen through a layer comprising $SiO_2$ into a substrate comprising Si, wherein the layer is on the substrate, and the layer is from about 30 Å to about 300 Å thick, and wherein the implanting causes defects;
    b) washing the semiconductor structure; and
    c) removing the defects, wherein removing the defects comprises annealing.

13. A process for making a semiconductor structure, comprising:
    a) implanting nitrogen through a layer comprising $SiO_2$ into a substrate comprising Si, wherein the layer is on the substrate, and the layer is from about 30 Å to about 300 Å thick, and wherein the implanting causes defects;
    b) washing the semiconductor structure; and
    c) removing the defects, wherein removing the defects comprises reoxidizing.

14. The process of claim 12 wherein the layer is from 70 Å to 130 Å thick.

15. The process of claim 12 wherein the layer is in contact with the substrate.

16. A process for making a semiconductor device, comprising:
    (a) making a semiconductor structure comprising:
        implanting nitrogen through a non-sacrificial layer comprising $SiO_2$ into a substrate comprising Si, wherein the layer is on the substrate, and the layer is from about 30 Å to about 300 Å thick, and wherein the implanting causes defects;
        washing the semiconductor device with an aqueous solution comprising ammonium hydroxide;
    (b) converting the semiconductor structure into a semiconductor device.

17. The process of claim 16, wherein making a semiconductor structure further comprises:
    after implanting nitrogen, forming an interface region.

18. The process of claim 16, wherein implanting nitrogen comprises using a mask to selectively implant nitrogen.

19. The process of claim 16, wherein implanting nitrogen comprises implanting nitrogen in an implanting region of the substrate according to a normal distribution pattern.

20. The process of claim 16, wherein washing the semiconductor device removes contamination.

21. The process of claim 1, wherein the implanting introduces contamination.

22. The process of claim 21, further comprising removing the contamination.

23. The process of claim 22, wherein removing the contamination comprises washing the semiconductor structure.

24. The process of claim 1, further comprising forming a mask on the layer prior to implanting the nitrogen.

25. The process of claim 1, wherein implanting the nitrogen comprises using a dose of about $1\times10^{13}$ $cm^{-2}$ to about $5\times10^{15}$ $cm^{-2}$ of nitrogen.

26. The process of claim 1, further comprising forming at least one additional semiconductor layer on the layer after implanting the nitrogen and removing the defects without removing the layer.

* * * * *